United States Patent [19]

Ferenbach et al.

[11] Patent Number: 4,746,417

[45] Date of Patent: May 24, 1988

[54] MAGNETRON SPUTTERING CATHODE FOR VACUUM COATING APPARATUS

[75] Inventors: Dagmar Ferenbach, Aachen; Gerhard Steiniger, Offenbach; Jürgen Müller, Frankfurt am Main, all of Fed. Rep. of Germany

[73] Assignee: Leybold-Heraeus GmbH, Cologne, Fed. Rep. of Germany

[21] Appl. No.: 896,927

[22] Filed: Aug. 15, 1986

[30] Foreign Application Priority Data

Jun. 6, 1986 [DE] Fed. Rep. of Germany ....... 3619194

[51] Int. Cl.⁴ .............................................. C23C 14/34
[52] U.S. Cl. ................................. 204/298; 204/192.12
[58] Field of Search ................. 204/298, 192.1, 192.12

[56] References Cited

U.S. PATENT DOCUMENTS 4,444,643 4/1984 Garrett ................................. 204/298
4,498,969 2/1985 Ramachandran .................... 204/298
4,631,106 12/1986 Nakazato et al. ............... 204/298 X

FOREIGN PATENT DOCUMENTS 2707144 8/1977 Fed. Rep. of Germany ...... 204/298

*Primary Examiner*—John F. Niebling
*Assistant Examiner*—Nam X. Nguyen
*Attorney, Agent, or Firm*—Felfe & Lynch

[57] ABSTRACT

A magnetron sputtering cathode for vacuum coating apparatus has a circular target plate and at least one magnet system disposed in back of it which forms at least one endless tunnel of magnetic lines of force over the target plate. In the marginal area of the target plate there is disposed a first magnet system for the production of a first magnetic tunnel substantially concentric with the axis of rotation, and between the axis of rotation and the first magnet system there is an off-center second magnet system which produces a second magnetic tunnel extending over only a sector of the target plate. When the two magnet systems are rotated together the elements of the surface of the target plate are exposed to the product of the time of stay times the intensity such that the target plate is ablated more uniformly in the middle area and more strongly at the margin, so that a substrate field placed opposite the target plate is uniformly coated.

3 Claims, 3 Drawing Sheets

MAGNETRON SPUTTERING CATHODE FOR VACUUM COATING APPARATUS

BACKGROUND OF THE INVENTION

The invention relates to a magnetron sputtering cathode for vacuum coating apparatus, which has a circular target plate of the material to be sputtered, and at least one magnet system disposed in back of the target plate and consisting of two endless rows of permanent magnets, one row inside of the other, the magnets of each row having the same polarity, but the magnets of the two rows being of opposite polarity, such that over the target plate at least one endless tunnel of magnetic lines of force is formed issuing from the one row of magnets and returning to the other row of magnets, and it has a driving means for the continuous rotation of the magnet system about the central axis of the target plate.

Magnetron sputtering cathodes are characterized by a sputtering rate which is greater by a factor of 10 to 30 than sputtering systems having no magnetic field enhancement. This advantage, however, is obtained with the disadvantage of an extremely irregular sputtering of the target plate, because the pinching of the plasma, which is produced in magnetrons by the magnetic tunnel, results in a corresponding spatial limitation of the sputtering effect. The formation of a deep erosion pit, whose deepest point is situated under the culmination points of the magnetic lines of force, calls for the termination of the sputtering action after only about 25 to 30% of the target material has been sputtered. In stationary coating systems, i.e., in those in which there is no relative movement between cathode and the substrates, this would result in very irregular coating thickness. Basically, an almost photographic image of the erosion pit would be formed on the substrates.

This problem, as well as a number of attempts at its solution, is addressed in DE-OS No. 27 07 144. Such attempts at a solution also include a magnetron sputtering cathode of the kind described in the beginning, in which a single endless magnet system rotates in an eccentric position behind a circular target plate (FIGS. 22 to 25). Aside from the fact that in this case only a minuscule part of the target surface is simultaneously exposed to the sputtering (a part of the magnetron effect being thus nullified) the sputtering rate on the target surface is also very irregular, because on the one hand the time of stay under the rotating magnetic tunnel is irregular, and because on the other hand the product of the intensity of the plasma—the so-called plasma density—multiplied by the time of stay, varies in the radial direction. An irregular sputtering rate, however, results not only in an irregular ablation of the target material but also in an irregular rate of deposit on the substrates being coated which lie opposite the target surface.

The invention is therefore addressed to the task of improving a magnetron sputtering cathode of the kind described in the beginning such that the coating thickness will be made uniform on the substrates being coated.

THE INVENTION

The solution of the stated problem is accomplished according to the invention in the sputtering cathode described in the beginning by the fact that
(a) in the marginal part of the target plate a first magnet system is disposed for the production of a first magnetic tunnel which is substantially concentric with the axis of rotation, and that
(b) between the axis of rotation and the first magnet system there is disposed a second, excentrically offset magnet system which produces a second magnetic tunnel which extends over only a sector of the target plate, such that, when the two magnet systems rotate together, the elements of area of the target plate are exposed to the product of time of stay times intensity such that the target plate is ablated more uniformly in the central area and more strongly at the margin, so that a substrate field mounted opposite the target plate will be uniformly coated.

The term, "substrate field," as used herein, is to be understood to mean either the area circumscribed by a circular outline of a single substrate or of a number of smaller substrates.

The feature (a) compensates the reduction of the rate of deposit otherwise to be observed in the marginal area of the substrate field. This is because it must be considered that elements of area on the substrates will receive less coating material in the marginal area of the substrate field, unless special measures are taken, because the sputtered particles move in different directions other than the perpendicular to the target surface, and an element of area of the substrate lying in the marginal area of the substrate field "sees" less target surface than a substrate lying in the center.

Feature (b) brings it about that even the area of the substrate field lying within the marginal area is coated uniformly. By means of the configuration of the sector and by shaping the second magnetic tunnel in this sector it becomes possible to achieve an extraordinarily uniform coating over the entire substrate field.

An optimation of the system can be achieved by shifting the magnetic tunnel on the yoke plate of the magnets if the technician should observe departures from the ideal coating thickness distribution.

It has been found in practical experiments that, by the combination of features (a) and (b), a very uniform coating thickness could be obtained on the substrates all the way into the marginal part of the substrate field.

It is not necessary for the first magnetic tunnel according to feature (a) to be concentric with the axis of rotation, so that the plasma will rotate "on the spot" without shifting crosswise. Instead, to regulate the distribution of the rate of deposit, it is possible to special advantage to make the first magnetic tunnel of a shape other than circular, for example, by a flattening or even an indentation at one or more points, or to cause the first magnetic tunnel to rotate slightly off-center. It is necessary only that the first magnetic tunnel be substantially concentric with the axis of rotation.

According to a further development of the invention it is especially advantageous if the second magnet system has an outer row of permanent magnets extending over three quarters of a circle, the fourth quarter being made up of permanent magnets of the inner row of permanent magnets of the first magnet system, and for the inner row of permanent magnets of the second magnet system to be disposed at substantially equal distances from the permanent magnets of opposite polarity.

In this manner the plasma discharges of the two magnet systems can be made directly adjacent one another, and furthermore some of the expensive permanent magnets can be dispensed with, as will be further mentioned in the detailed description.

Lastly, according to still another embodiment of the invention, it is especially advantageous if all of the permanent magnets are disposed on a rotatable ferromagnetic yoke plate which is coaxial with the target plate, and which is fastened on a hollow shaft, and if the two rows of magnets of the second, inner magnet system, are on both sides of the opening of the hollow shaft.

BRIEF DESCRIPTION OF THE DRAWING

Two embodiments of the subject matter of the invention will be explained below in conjunction with FIGS. 1 to 3.

DETAILED DESCRIPTION OF PREFERRED EMBODIMENT

Figure 1:
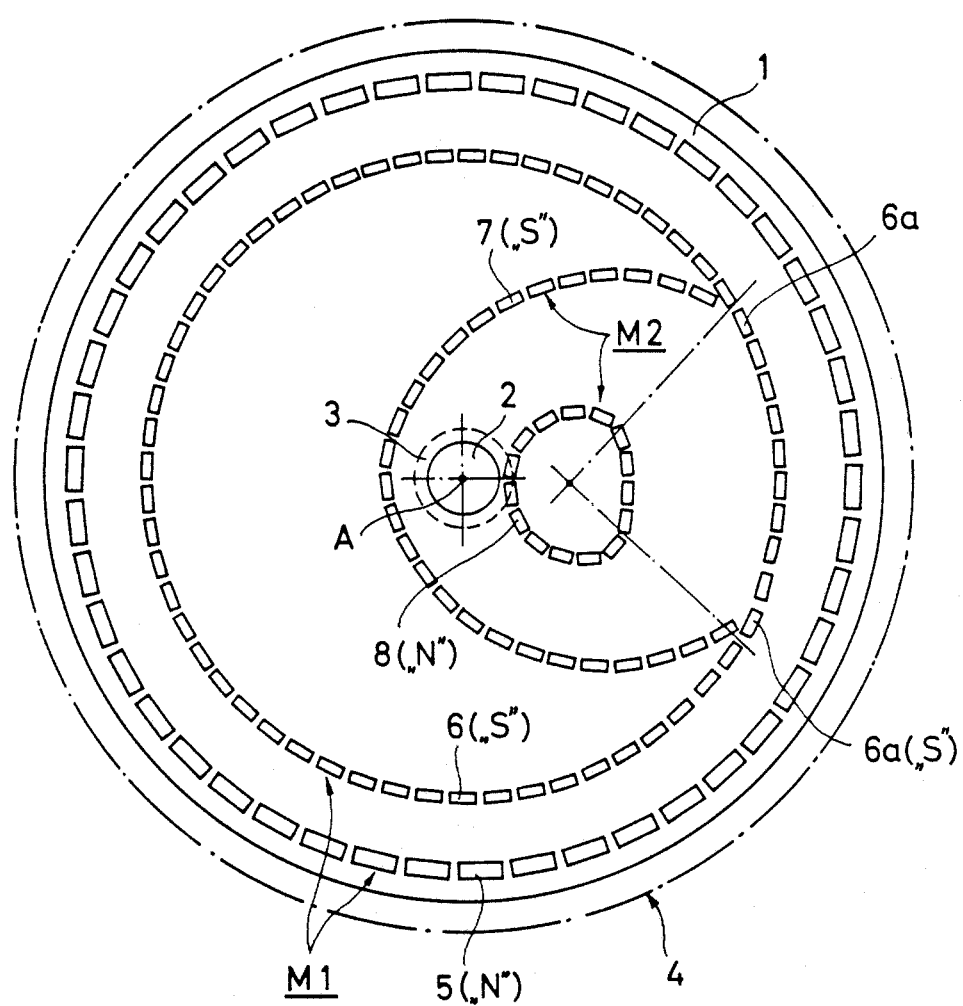
FIG. 1 is a top plan view of the magnet systems of a magnetron sputtering cathode according to the invention.

In FIG. 1 there is represented a circular yoke plate 1 which has in its center an opening 2 which communicates with a hollow shaft 3 to which the yoke plate 1 is fastened. The yoke plate 1 is rotatable about a common concentric axis A by means of this hollow shaft 3. This yoke plate is almost as large as the target plate represented in FIG. 2, so that its geometry is largely the same as that of the target plate. The margin of the target plate 4 is represented in broken lines in FIG. 1.

It can be seen that, in the marginal area of the target plate 4, there is disposed a first magnet system M1 which consists of two endless rows of permanent magnets 5 and 6 lying concentrically one within the other, the magnets 5 of the outer row having the same polarity ("N," for example), but a polarity opposite that of the inner magnet row 6. The magnets 6 of the inner row have, for example, the polarity "S." Thus an endless tunnel of magnetic lines of force is formed, issuing from the magnet row 5 and returning to the magnet row 6, in a known manner, over the target plate 4. The first magnet system M1 produces, in the case of FIG. 1, a magnetic tunnel concentric with the axis of rotation A.

Between the axis of rotation A and the first magnet system M1 there is a second, off-center magnet system M2 which likewise consists of two rows of permanent magnets 7 and 8 disposed one inside the other, the magnets 7 of the outer row all having the same polarity (e.g., "S"), but it is the opposite of the polarity of the inner row of magnets 8. The magnets 8 of the inner row again have all the same polarity (e.g., "N"). This brings it about that a second endless tunnel of magnetic lines of force is built up over the target plate 4, in which the lines of force issue from the one row of magnets (7) and return to the other row of magnets (8). It can furthermore be seen that the magnet system M2 and the magnetic tunnel it forms extend over only one sector of the target plate, namely over about one quadrant of the target plate 4.

It can furthermore be seen from FIG. 1 that the outer row of permanent magnets 7 of the second magnet system M2 extends over three quadrants of a circle, i.e., leaves open a fourth quadrant which is indicated by the two broken lines. Within the fourth quadrant, the row of the permanent magnets 7 is replaced by permanent magnets 6a of the inner row of permanent magnets 6 of the first magnet system M1, so that in this quadrant the directly adjacent parallel arrangement of magnets of the same polarity is avoided and the number of magnets is reduced.

At the same time the permanent magnets 8 of the inner row of the second magnet system M2 are substantially equally distanced from the permanent magnets 7 of opposite polarity.

When the magnet system according to FIG. 1 is rotated relative to the target plate 4, the effect will be that each element of area of the target plate 4 will be exposed to approximately the same product of time of stay times plasma intensity, such that the middle area will be ablated more uniformly and more strongly at the margin, so that a substrate field mounted opposite the target plate will be uniformly coated.

Figure 2:
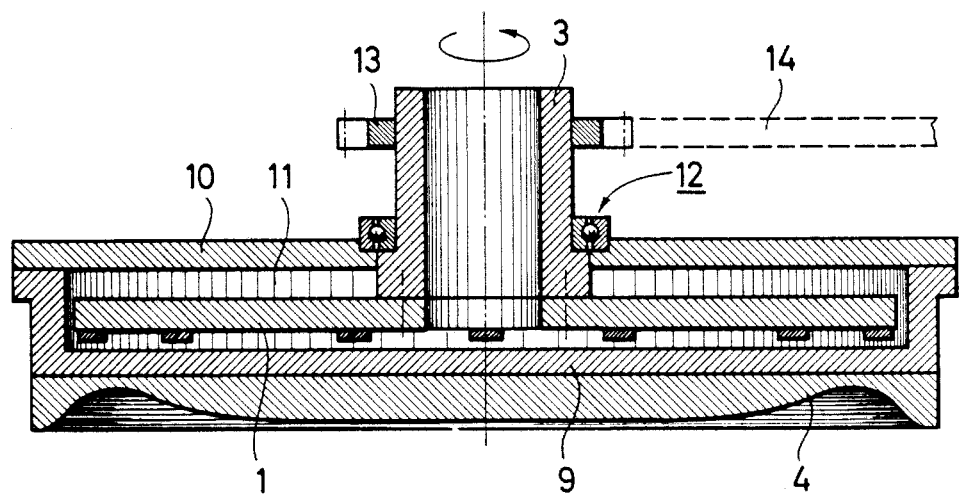
FIG. 2 is an axial section through a magnetron sputtering cathode with the magnet systems according to FIG. 1.

In FIG. 2 it is shown that the target plate 4, which already shows a decided consumption of its material, is fastened on a cathode base body 9 (for example by soldering or bonding) which consists of a discoidal copper pan. The cathode base body 9 is fastened to a support plate 10 which in turn is joined through insulators, not shown, to the vacuum chamber which also is not shown. Between the cathode base body 9 and the support plate 10 a shallow cylindrical cavity 11 is formed in which the yoke plate 1 is disposed rotatably and concentrically with the permanent magnets (dark areas) which are not further designated herein. For the purpose of the rotation of the yoke plate 1, it is fastened to the hollow shaft 3 which is supported on the support plate 10 by a rotatable bearing 12. The hollow shaft 3 serves for the introduction and removal of cooling water, the cooling water lines being omitted for the sake of simplicity. The hollow shaft 3 is rotated through a sprocket 13 and a cogbelt 14.

Figure 3:
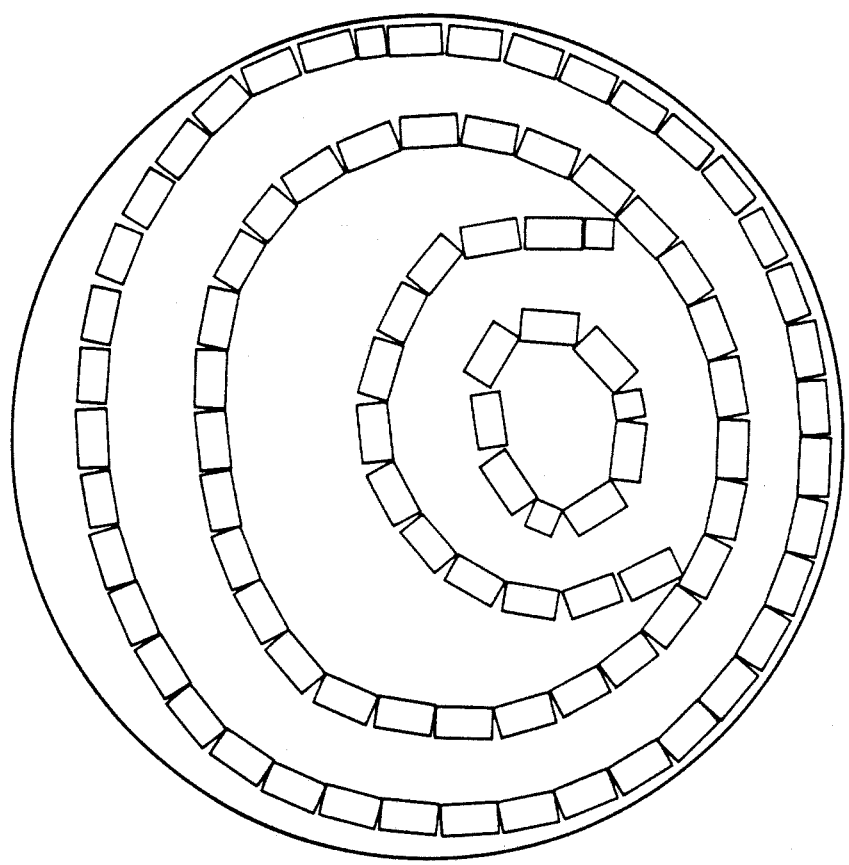
FIG. 3 is a top plan view of a variant of the subject of FIG. 1, in which the outer magnetic tunnel is set slightly inward radially on part of the circumference of the target plate.

FIG. 3 shows the arrangement in scale of the individual permanent magnets, which is largely the same as FIG. 1, so that numbering has been omitted. It can be seen, however, that the two rows of permanent magnets of the first or outer magnet system M1 are offset slightly radially inwardly on a part of the circumference of the yoke plate 1, so that the outer magnetic tunnel performs a kind of wobbling movement when rotated relative to the target plate. This wobbling movement of the magnetic tunnel is followed, of course, by the plasma confined within the magnetic tunnel. Similar considerations also apply to the plasma confined by the second, inner magnet system M2, though to a much greater extent. The two plasma chambers and their rotatory movement compensate one another advantageously and bring about a uniform and full-surface coating of the substrate or substrates within the substrate field.

We claim:

1. Magnetron sputtering cathode for vacuum coating apparatus, comprising: a circular target plate of the material that is to be sputtered, and at least one magnet system which is disposed in back of the target plate and includes two closed rows of permanent magnets in which the magnets of each row have the same polarity, but the magnets of each of the two rows being of opposite polarity, such that over the target plate at least one closed tunnel is formed of magnetic lines of force issuing from the one row of magnets and returning to the other row of magnets, and drive means for the continuous rotation of the magnet system about the central axis of the target plate, in the marginal area of the target plate a first magnet system including said two closed rows of permanent magnets being disposed for the production of a first magnetic tunnel substantially concentric with the axis of rotation, and between the axis of rotation and the first magnet system an eccentrically offset second magnet system being disposed, which produces a second magnetic tunnel which extends only over a sector of the target plate, such that, upon a common rotation of the two magnet systems the elements of surface of the target plate are exposed to the product of residence time times intensity such that the target plate is ablated more uniformly in the middle area and more strongly at the margin, so that a substrate placed opposite the target plate is uniformly coated.

2. Magnetron sputtering cathode according to claim 1, in which the second magnet system has an outer row of permanent magnets which row extends over a three-quarter circle whose fourth quadrant is provided by permanent magnets of an inner row of permanent magnets of the first magnet system, and in which the second magnet system has an inner row of permanent magnets running at substantially equal distances from the outer row of permanent magnets of opposite polarity of the second magnet system.

3. Magnetron sputtering cathode according to claim 1, which includes a rotatable ferromagnetic yoke plate, coaxial with the target plate, which is fastened on a hollow shaft and in which cathode all permanent magnets are disposed on the rotatable ferromagnetic yoke plate, and in which cathode the two rows of magnets of the second, inner magnet system run on both sides of the opening of the hollow shaft.

* * * * *